United States Patent [19]

LeRoux et al.

[11] Patent Number: 5,055,791

[45] Date of Patent: Oct. 8, 1991

[54] NMR MACHINE PHANTOM AND A METHOD OF MEASURING THE CHARACTERISTICS OF A MAGNETIC FIELD USING SUCH A PHANTOM

[75] Inventors: Patrick LeRoux, Paris; Agnés Malgouyres, Palaiseau; Jean Bossaert, Ablis, all of France

[73] Assignee: General Electric CGR S.A., Paris, France

[21] Appl. No.: 310,723

[22] PCT Filed: Jul. 2, 1987

[86] PCT No.: PCT/FR87/00259

§ 371 Date: Jan. 5, 1989

§ 102(e) Date: Jan. 5, 1989

[87] PCT Pub. No.: WO88/00340

PCT Pub. Date: Jan. 14, 1988

[30] Foreign Application Priority Data

Jul. 8, 1986 [FR] France ................. 86 09894

[51] Int. Cl.⁵ ............................. G01R 33/20
[52] U.S. Cl. ........................... 324/318; 324/309
[58] Field of Search .............. 324/300, 307, 309, 310, 324/311, 312, 313, 314, 318, 322, 319, 320; 128/653 SC

[56] References Cited

U.S. PATENT DOCUMENTS 4,585,992 4/1986 Mandoley et al. ............ 324/309
4,749,948 6/1988 Duby et al. ................... 324/320

FOREIGN PATENT DOCUMENTS 0133722 3/1985 European Pat. Off. .
2567648 1/1986 France .

OTHER PUBLICATIONS

Proceedings of an AAPM Summer School, Portland, US, Aug. 4-9, 1985, R. R. Price et al.: "Concepts of Quality Assurance and Phantom Design . . . ".
IEEE Transactions on Medical Imaging, vol. 4, Dec. 1985, New York, USA, K. Sekihara et al.: "NMR Imaging for Magnets with Large Nonuniformities", pp. 193-199, See Chapter II, A.B.C., 4, 8-11.
S. R. Thomas et al: "NMR in Medicine: The Instrumentation and Clinical Applications", American Institute of Physics, Inc., New York, US, 1986, pp. 415-444.
Patent Abstracts of Japan, vol. 9, No. 109 (P-355) (1982), May 14, 1985, & JP, A 59230149 (Hitachi Seisakusho K.K.) Dec. 24, 1984.
Patent Abstracts of Japan, vol. 10, No. 160 (P-465) (2216) Jun. 7, 1986, & JP, A, 6113142 (Hitachi Seisakusho K.K.), Jan. 29, 1986.

Primary Examiner—Michael J. Tokar
Attorney, Agent, or Firm—Oblon, Spivak, McClelland, Maier & Neustadt

[57] ABSTRACT

The formation of a NMR machine phantom having a homogeneous material serving for forming the image which is confined to precise positions. The precise positions are evenly distributed in the form of a matrix so that a particular image formation method may be used. The combination of the image formation method and the matrix distribution allows for obtaining information with respect to the field at numerous points and increases the speed at which these points are determined.

11 Claims, 3 Drawing Sheets

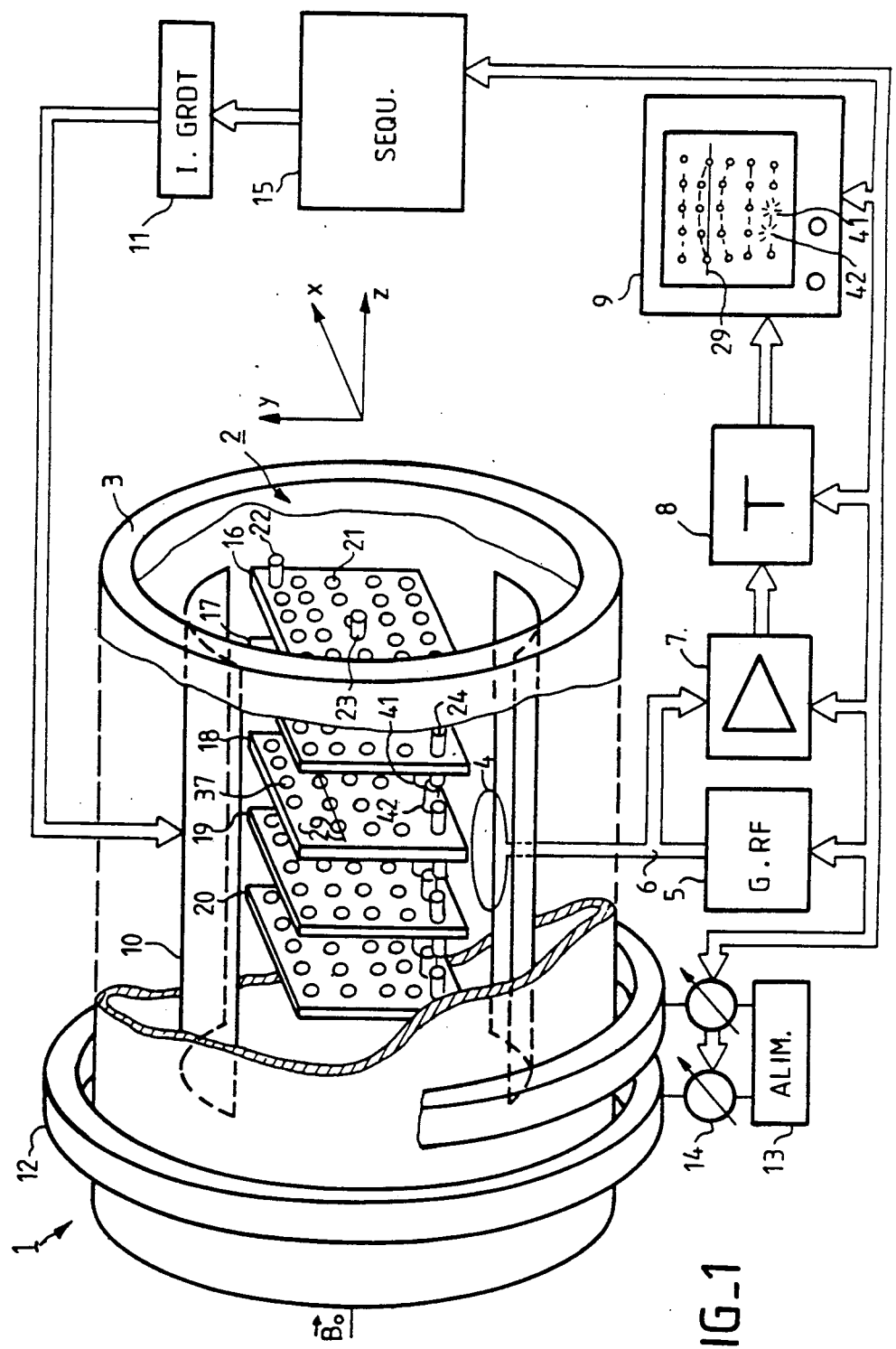
FIG_1

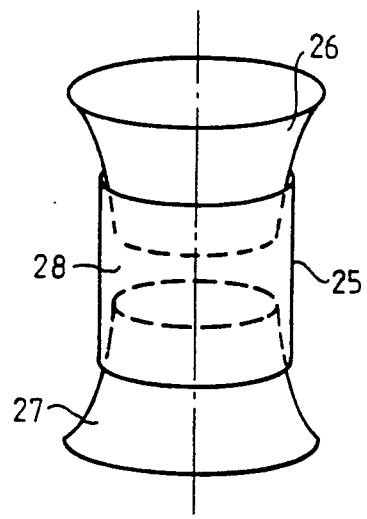
FIG_2
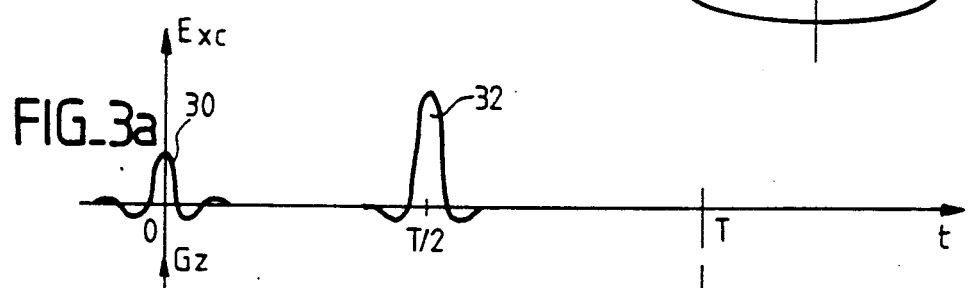
FIG_3a
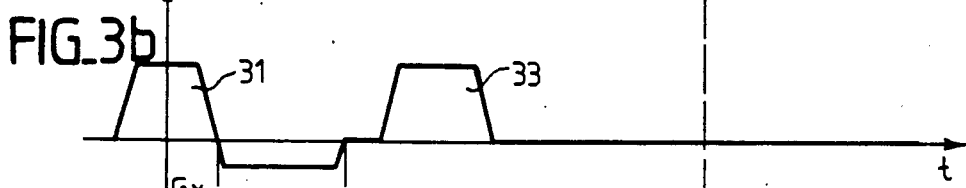
FIG_3b
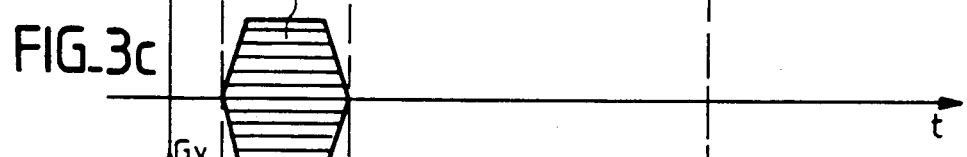
FIG_3c
FIG_3d
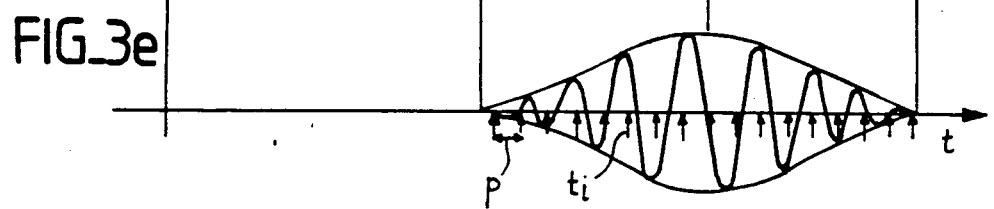
FIG_3e

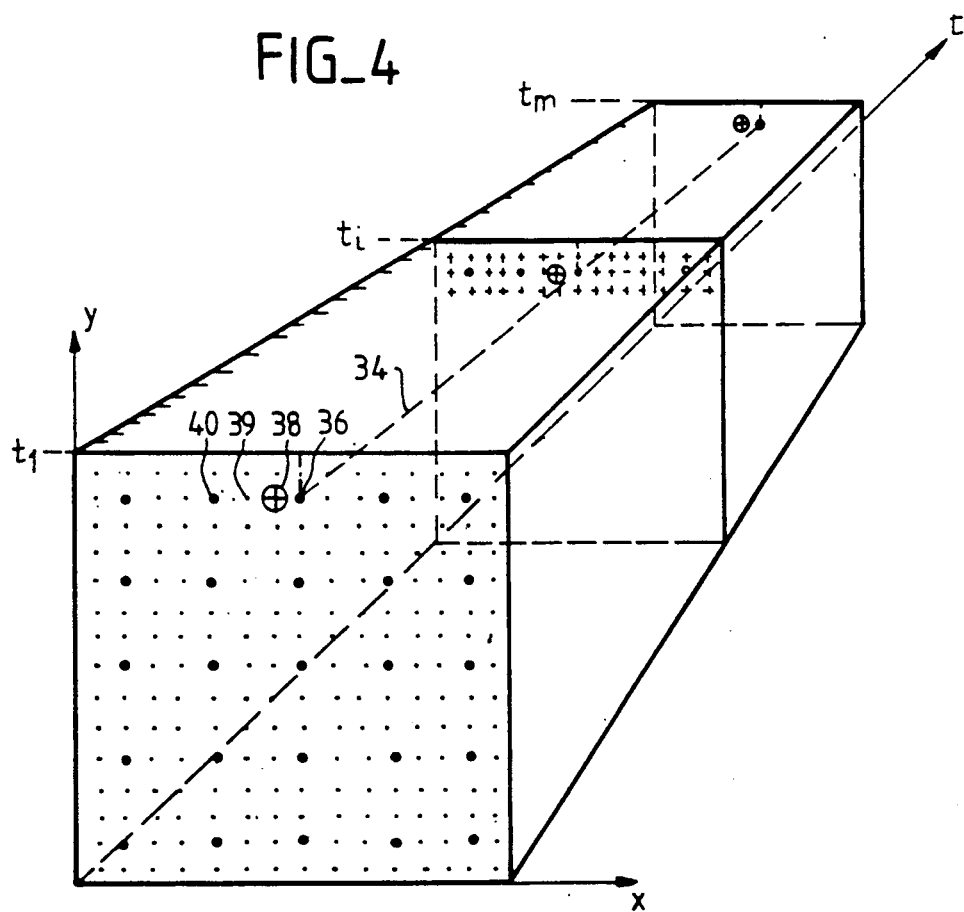
FIG_4
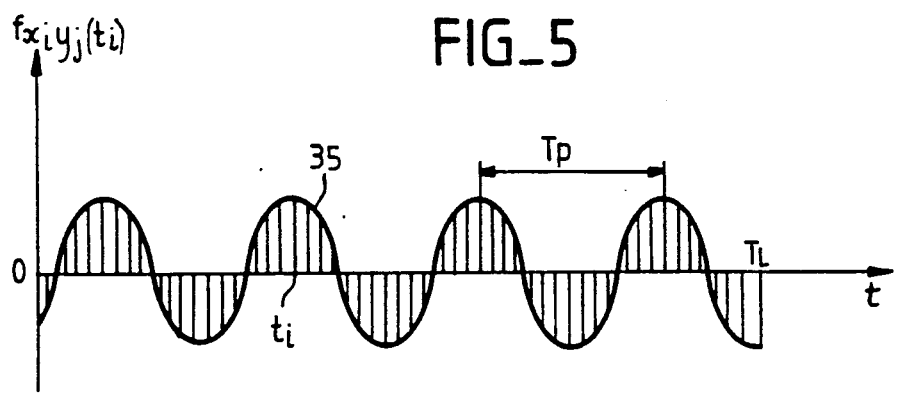
FIG_5

NMR MACHINE PHANTOM AND A METHOD OF MEASURING THE CHARACTERISTICS OF A MAGNETIC FIELD USING SUCH A PHANTOM

BACKGROUND OF THE INVENTION

The present invention relates to a nuclear magnetic resonance (NMR) machine phantom and a method of measuring the characteristics of a magnetic field using such a phantom. It finds its use more particularly in the medical field where such machines are used for helping diagnosis in man.

An NMR machine essentially includes means for producing a constant orientator magnetic field, intense and homogeneous in a zone of interest. A body to be examined is placed in this zone and the magnetic moments of the nuclei of the particles of this body tend to be aligned with this orientating field. Under these conditions, the body is subsequently subjected to radiofrequency excitation which causes the orientation of the magnetic moment to swing. When the excitation ceases, the magnetic moments are realigned with the constant field while restituting the energy received during the excitation. The restitution signal is picked up and is processed so as to reveal the structures of the internal parts of the body under examination. The response of the body is a volume response: all the particles subjected to examination emit their restitution signal at the same time. So as to differentiate the signals relative to different parts of the body the excitation is applied in the presence of a space coding. This coding consists in administering additional constant fields, different in different positions in space. In fact, the resonance phenomenon, at each position, depends on the amplitude of the constant field and on the characteristics of the particles examined. In the medical field the particles which it is desired to cause to resonate are the hydrogen atoms contained in water as well as in all organic substances, and whose concentration varies from one tissue to another.

FIELD OF THE INVENTION

The very principle of image forming methods requires the orientating field and coding of the space to be scrupulously accurate. In particular, if the orientating field is not homogeneous, if it is different at different positions of the zone of interest, it introduces parasite coding which falsifies the image. Similarly, the additional coding fields must be known with precision: these coding fields often develop linearly along an axis. Their linear variation is comparable to a gradient: whence their name. The field gradients must be particularly linear. Any distortion of their linearity also introduces parasite coding which falsifies the image. In a first stage, it was considered that the coding parasites affecting the very powerful orientating field were preponderant. Thus, the machines of the prior art include means for correcting the homogeneity of the field, which are adjusted so as to make this field homogeneous. These correction means (called shims in the technique) are adjustable and their value is adjusted on the site as a function of the inhomogeneity discovered.

DESCRIPTION OF THE PRIOR ART

In the prior art, it is known to measure the inhomogeneity of the orientating field in its zone of interest by moving a probe measuring the magnetic field from point to point in this zone. In practice, in a cylindrical zone of interest whose diameter is slightly more than 50 cm and whose height is of the same order, in order to know the homogeneity of the field with sufficient accuracy, it is known to measure its value at a number of points of the order of one or several hundred. Depending on the inhomogeneity discovered, in the known methods, the correction means are adjusted for correcting the homogeneity. For greater accuracy, or quite simply for checking, it may be useful to reiterate, after the first correction, the operation for measuring the homogeneity of the field. More generally, since the intense field is subjected to drifting, it may be useful to re-establish its homogeneity often, for example once per day. So that the measurements are made under good conditions, at each measuring operation the probe must be placed in the same positions of the zone of interest. A mechanical apparatus is then necessary for this purpose. Since the probe must be moved accurately from position to position, it means that the measurement is time consuming. It lasts several hours. This means that it cannot be carried out too frequently, which is however made necessary by the inevitable drifts of the orientating field.

Knowing that, in their configuration NMR apparatus have been provided for delivering images, attempts have been made to introduce an homogeneous phantom into the zone of interest and to form the image of it. The intention was to reveal the inhomogeneities of the field by distorting this image which must theoretically be homogeneous. This technique has unfortunately come up against an insurmountable drawback: the image is representative of the inhomogeneities of the orientating field, on the one hand, and of the inhomogeneities of the field gradients, which have precisely served for producing the image, on the other hand. Consequently, the use of the image of such a phantom has proved unusable for it only establishes the cumulative deficiency of the two types of inhomogeneity, without it being possible to define the participation of each of them therein so as to allow the respective correction thereof.

SUMMARY OF THE INVENTION

In the invention, this drawback is overcome by forming a phantom which, while being homogeneous, is discrete. This means that the homogeneous material of the phantom which will serve for forming the image is confined to precise positions. In a preferred example, these precise positions are even distributed in the form of a matrix. Thus, a particular image formation method, known in another connection, may be used. The performance of this method is then judiciously used and, in combination with the matrix distribution, allows the desired aims to be reached: knowledge of the field at numerous points and speed of making the measurements. It will be shown in the present description that it is possible to differenciate the participation of each of the means used in the inhomogeneity: the orientating field on the one hand, the field gradients on the other; To sum up, we may say that the image to be produced is known since it is known how the phantom was formed. Consequently, it is known where the points representative of the discrete locations where the resonating material is to be found are situated in this image. If the image is distorted, for example if the locations are not aligned rectilinearly but rather along a curve, it can be deduced that the distortion is due to the gradient. Furthermore, in practice, the movement in the rendered image of the image of a discrete element of the resonating material with respect to its expected image is such that it can be immediately known what the movement is undergone by this image point. It cannot be confused with another. So the distortion of the gradients can be measured and known. Furthermore, the luminosity contrast parameter in the image is alone representative of the inhomogeneity of the orientating field. Thus it may be known simply. It is then conventional to deduce the corrections to be applied to the orientating field. The frequency of repetition of the operations for correcting the homogeneity of the field is furthermore of prime importance. It is then important to obtain the result rapidly. In the invention, it is shown that the matrix arrangement of the discrete location, because of the periodicity of distribution, allows the finest possible definition resolution of the inhomogeneities to be obtained for given a measuring time which is as small as possible.

The present invention provides then a phantom for a NMR machine having means for confining a resonating material in discrete locations, these locations being distributed in the form of a matrix in directions orthogonal to each other and parallel to the main image-forming axes of the machine, these locations being evenly spaced apart in a meshed network.

It also provides a method of measuring the characteristics of a magnetic field, more particularly its homogeneity including the following steps:
the formation of a phantom with means for confining a resonating material at discrete locations, distributed in the form of a matrix in directions orthogonal to each other,
the placing of this phantom at a position of the field to be known,
subjecting this phantom, at this position, to magnetic energization sequences in the presence of magnetic field gradient sequences these gradients being oriented parallel to the directions of the phantom,
measurement of the de-energization signals emitted by the resonating material when the energization ceases and in the absence of gradient sequences,
and processing of the de-energization signals so as to extract therefrom one or more images representative of the field to be known.

BRIEF DESCRIPTION OF THE DRAWINGS

The invention will be better understood from reading the following description with reference to the accompanying Figures which are only indicative and in no wise limitative of the invention. In the Figures, the same references refer to the same elements. The Figures show:

FIG. 1: an NMR machine with a phantom in accordance with the invention,

FIG. 2: a test piece for confining the resonating material used in the phantom;

FIG. 3(a-e), timing diagrams of the energization and measuring signals used in the method of the invention;

FIG. 4: the representation of the images of one of the sections of the phantom; and FIG. 5: the characteristic of inhomogeneity of the orientating field at the position of one of the discrete locations in accordance with the invention.

DESCRIPTION OF THE PREFERRED EMBODIMENT OF THE INVENTION

FIG. 1 shows an NMR machine 1 provided with a phantom 2 in accordance with the invention. Machine 1 includes essentially means 3 for producing an intense and homogeneous magnetic field $B_0$ in its zone of interest. Here the magnet 3 is symbolized by a cylindrical tube, the zone of interest is inside this tube, the phantom is placed in this zone of interest the machine further includes a radiofrequency antenna 4 connected to a generator 5 for producing a radiofrequency energization of the body placed under the influence of the field $B_0$. When the energization ceases, the antenna 4 serves for picking up the de-energization signal emitted by the body under examination. This signal is fed through a duplexer 6 to reception means 7. The signal received is then processed by processing means 8 for producing images representative of the distribution of the resonating material in the body. These images may be displayed on a display device 9.

Gradient coils 10 have also been shown fed by a gradient pulse generator 11. The pulses serve for coding the space by adding to the orientating field additional fields whose value evolves linearly (gradient) along three orthogonal axes. It is usual to reference these three axes, x, y, z, while orientating the last of them parallel to field $B_0$. This is not an obligation but corresponds to a custom common to all the technicians in NMR. The NMR machine 1 further includes correction means such as 12, fed from a power supply 13, and whose power of correction is adjustable by means of controls 13. The assembly of all these means is under the control of a sequencer 15 which may be assigned to multiple tasks. In particular, the sequencer 15 serves for implementing the energization-measurement sequence programs. It further serves for driving the processing means for forming the images from the measurements. It may finally serve for controlling the adjustment of the homogeneity of the field by acting on controls 14.

The discrete phantom of the invention includes, in a preferred example, an assembly of plates 16 to 20, parallel to each other and aligned with each other along the axis z. The different plates of the phantom are connected together by spacers, not shown, or by any other mechanical holding means. Phantom 2 is relatively rigid so that it may be handled without inconvenience. Each plate is provided with an assembly of holes such as 21 distributed in matrix form and evenly along two axes orthogonal to the alignment axis. These two orthogonal axes are oriented, by orientating the phantom, so as to be parallel to the main image-forming axis of the machine 1 (axes of gradient 10). In each of the holes is inserted a test piece such as 22, 23 or 24 each test piece includes a tube 25 closed at each end by a plug 26, 27. Each test piece is filled with a resonating material 28: in practice, this resonating material may quite simply be water. The material forming the plates, the spacers, the test pieces which are inserted, and the plugs for the test pieces is preferably a material which does not resonate at the useful frequencies of the experiment, or at least resonates only little: it includes little hydrogen. In one example, the body of the phantom is made from PVC.

With all the holes of each plate filled with a test piece, the image of a plate, for example plate 18, should appear on the screen of device 9 as an arrangement of evenly divided points. The line 29 representing the alignment of the points of plate 8 shows on the screen of device 9 the influence of the coding gradients of the space. The different image points are no longer aligned along a straight line. It is however quite possible to detect the location of their measured image and to assign to each of them the theoretical position which it should have occupied. The difference between the theoretical position and the measured position indicates the defect of linearity of the coding gradients. From this defect, which may be measured, the defect of the gradients may be quantitatively deduced. These gradients may possibly be modified from this information. By taking it into account, the images produced by the machine may also be modified.

With reference to FIGS. 3 to 5, it will now be described how the phantom also allows the inhomogeneity of the orientating field $B_0$ to be measured. In the invention, the restitution signal is read at the end of each of the energization sequences of an assembly of sequences which are of the type used (but for another purpose) in the U.S. Pat. No. 4,553,096 published on the 12 November 1985. FIG. 3 of the present description recalls the general organization of these sequences. At each sequence of the assembly of sequences, at the date $t=0$, a 90° radiofrequency energization pulse 30 is emitted in the presence of a selection field gradient $G_z$ pulse 31. Thus the resonating material contained in the test pieces of a single one of the plates (for example plate 18) is energized. After a time $T/2$, a second 180° radiofrequency energization pulse 32 is emitted also in the presence of a second selection field gradient pulse 33. The energization thus constructed is so called spin echo energization. It allows the restitution signal to be measured about a date $T$ (with a duration $T_1$) fairly far removed from the date of emission of the energization pulse 30.

The time which separates these two dates is used for applying field gradients along the other two axes $G_x$ and $G_y$, with variable values from one sequence to another.

For example, during a first series of sequences, the gradient pulse $G_y$ is always the same, whereas from one sequence to another of this series the gradient pulse $G_x$ (proportional to $k_i$) varies. Then, during the next series of sequences, gradient $G_y$ takes on another value (proportional to $k_j$) whereas gradient $G_x$ again takes from one sequence to another of this series the same different values as for the sequences of the preceding series of sequences. It is important to note that, contrary to conventional image forming methods, there is here no application of a reading gradient during the measurement-reading ($T_l$) of the restitution signal. This feature will be justified by the explanation relative to FIG. 5. If n is the number of different possible values of $k_i$ and/or $k_j$, we will have a set of $n \times n$ measurements. During each of these measurements, the restitution signal is sampled at dates separated from each other by a time p (FIG. 3e). We then have a large number of samples whose values v depend on the date of the sample ($t_i$) and on the characteristic of the sequence which caused its appearance ($k_i$ and $k_j$). From this set of samples v ($t_i$, $k_i$, $k_j$) it is possible to obtain, by a double Fourier transform, a set of values $f(t_i, x, y)$ representative, for a given $t_i$, of the value of the image at x and y of a cross section studied (plate 18 in FIG. 4). The absence of the reading gradient, which deprives this image forming method of the benefit of the frequency differenciation which this gradient gives, is compensated for by the double x and y coding at the time of energization. The image reconstruction, by two dimensional Fourier transform, is however of the same type as for the 2 DFT methods.

Since m samples were taken during the time $T_l$, m images may then be represented each corresponding to one of the sampling dates of the measured signal. In FIG. 4 it can be seen that, for each of the m images, the real image shown by an encircled cross of one of the test pieces of resonating material is not in the position where it should theoretically have been. This theoretical position corresponds to the alignment 34. Under a certain condition, which will be discussed further on, it is shifted therefrom by a value representative of the distortion of the coding gradients of the space at the position of this test piece.

In FIG. 5 has been shown, for a localization $x_i$, $y_j$ of each of the images of FIG. 4, the value of f as a function of the date $t_i$ at which it was calculated. These values follow a curve 35 which may be plotted. The meaning of this curve is the following. When the restitution signal is received, it is known to demodulate this signal by means of a signal at a frequency $f_0$ equal to the theoretical frequency at which the material should have resonated if, at the position where this material was situated, the intense field had had the prescribed value: $B_0$. If such is the case, the restitution signal relative to the one considered corresponds to a precessional movement at frequency $f_0$ of the magnetic moment, and demodulation thereof followed by double Fourier transform processing gives a constant or zero value f. On the other hand, if at the position of the test piece considered, there exists a slight inhomogeneity $\Delta B_0$, of the field $B_0$, the restituted signal vibrates at a frequency offset from $f_0$ by a value $\Delta f_0$ proportional to the inhomogeneity in question. Curve 35 corresponds to such a case. In fact, the value of f evolves in time. It shows a frequency beat with respect to the demodulation frequency. From the timing diagram of FIG. 5, it is possible to derive a $\Delta f_0$ equal to the inverse of the period $T_p$ of the cyclic beat of f ($t_i$). It is possible to avoid having to solve graphically the problem of finding $T_p$ by carrying out a third Fourier transform, of f ($t_i$), which immediately gives the shift $\Delta f_0$ of the precessional frequency. At each point, point 36 of the theoretical image corresponding to a real point 37 in the plate examined (see FIG. 1), the value of the inhomogeneity $\Delta B_0$ is then known; although this latter has been revealed as being situated at a position 38 offset from its true position. With this information, after processing of a known type, the controls to be applied to the control member 14 may be derived. Preferably, this work is carried out automatically by the sequencer 15. It is however noted that the beat is only measurable because there is no reading gradient during the measurement.

From the diagram of FIG. 5, it is clear that the largest measurable inhomogeneity (so the smallest detectable period $T_p$) corresponds according to Shannon to a maximum frequency shift equal to $1/2\ p=m/2T_1$. Similarly, the lowest measurable beat frequency is such that $T_p=T_l$. In other words, the revelation dynamics of the inhomogeneities are contained in a given range. In one example where $f_0$ is of the order of 20 MHz, where $T_l$ is equal to 50 milliseconds and where m is equal to 128 samples during $T_l$), at most beats may be detected of 1/50 milliseconds equal 20 Hz. This beat frequency represents one part per million of the resonance frequency $f_0$. It corresponds then to an inhomogeneity of one part per million (ppm) of the value of the constant homogeneous field. For the given value of m, under the same conditions, only inhomogeneities can then be shown less than m/2 ppm, namely 64 ppm. If it is desired, with the method of the invention, to see greater inhomogeneities than this value, either m should be increased with $T_I$ constant, or $T_I$ reduced with m constant.

The increase of m may cause processing difficulties. In fact the Fourier transform calculations risk becoming too long if m is greater than 256. On the other hand, the technology allows a lower measuring time T to be chosen while taking the same number of samples. For example, T may be chosen equal to 25 milliseconds and m=256. This will show inhomogeneities up to 1024 ppm. The daily drifts of which it is a question are in general less than this value. In other words, for the same section of the zone, that where plate 18 is situated, the results may be acquired the first time by making two series of experiments with different sampling frequencies and sampling times. Then, for the daily corrections, it will be sufficient to make a single acquisition.

Moreover, all the work undertaken for a cross section of the zone of interest, at the position of plate 18, is obviously undertaken for the other sections of the zone of interest, where the other plates of the phantom are to be found. For this, it is simply sufficient to change the value of the energization frequency at the time of energization. This technique is known in multisection NMR image forming methods. However, in as much as the inhomogeneities of the x and y gradients were readily perceptible, the inhomogeneities of gradient z have effects which pass unoticed. In fact, the defects of gradient z cause for some points of the section, a forward or rearward shift of the image. In other words, for these points, their image is in a plane offset from the one which shows the image of the selected plate: they disappear from this image. Thus images 41 and 42 of test pieces 41 and 42 of plate 18 are not present in its image. To find them again, it is sufficient to select cross sectional planes upstream or downstream of plate 18. If gradient z has been linear, we could have parts of the space where there is nothing: in the invention, additional cross sections show the missing images.

In one example, taking the measurements and processing the measured signals for providing beat signals (FIG. 5) relative to each location of a plate lasts about 4 minutes. For 5 plates, the experimentation time is also 4 minutes taking into account interlaced processing. Because of the inhomogeneity of gradient z, the fact of having to triple the number of cross sections may lead to a time of 12 minutes. These times are to be compared with those mentioned in the cited state of the art. They are much shorter. Furthermore, the simplicity of positioning the phantom inside the zone of interest of the magnet has nothing comparable with the complexity of handling the probe carrying apparatus of the cited state of the art.

The number of sequences in each series, and the duration of the mathematic processing required for forming the images of FIG. 4, relative to the dates of different samples, are all the greater the greater the desired resolution of these images. It has been found that it is sufficient to represent the images, at the dates of each of the samples, with a resolution whose pitch is only three times finer than the pitch of distribution of the resonating material in the phantom. In fact, because of the gradient inhomogeneities, which are small, the "measured" localization is close to the theoretical localization to be reached. The ratio of 3 is such that it allows an image to be accepted at a point 38 of a theoretical location at 36, and an image to be accepted at a point 39 of an adjacent theoretical location at 40, without the risk that the images measured at 38 and 39 may merge. This could however be the case if the resolution of the representation were equal to the distribution of the test pieces in the plates of the phantom. Or even if it were only equal to twice this distribution.

In practice, each plate has 25 test pieces in a 5×5 matrix. It is then sufficient, in the image represented on device 9, to have a resolution by 16 (3×5≃16) along each axis so as to designate the measured images of the real points without any risk of mixing. The divison of screen 9 into a 16×16 grid leads automatically to only having 16 values for $k_i$ and only 16 for $k_j$. This reduces as much as possible the time of experimentation by limiting the number of sequences in each series of sequences. It will then be readily understood that any distribution of the test pieces, not in the form of a matrix, not regular and not oriented along the image forming axes does not allows this result to be reached. In fact, if the distribution is not regular, this resolution must be adapted to the most unfavorable cases, that is to say to the test pieces the closest to each other. For example, with a cylindrical distribution, inner test pieces, closest to each other than peripheral test pieces, impose a resolution finer than that necessary for differentiating the external test pieces. Furthermore, with the gradients oriented along predetermined axes (x,y,z), any oblique distribution of the test pieces with respect to these axes reduces the differenciation as a function of the cosine of the slant angle. The resolution of the image (and so its reconstruction time) must then be increased correspondingly to separate the different contributions.

We claim:

1. A NMR imaging machine including a phantom provided by a means for confining a resonating material in discreet locations, said locations being distributed in the form of a matrix along directions orthogonal to each other and said locations being evenly spaced from each other in a meshed network, said machine further including a main image forming axes defined by gradients of said machine wherein said orthogonal directions of said phantom are parallel to the main image forming axes of said machine.

2. The machine according to claim 1 wherein said confining means includes at least one plate made of a material which does not resonate at a useful frequency wherein said plate is pierced with holes at the position of said discrete location and closed test pieces constructed of a material which is non-resonant at a useful frequency and wherein said closed test pieces are placed in said holes.

3. The machine according to claim 2 further including a plurality of plates which are aligned and spaced from each other along the direction perpendicular to the plane of said plates.

4. A method of measuring the characteristics of a magnetic field and in particular the homogeneity of said magnetic field, said method comprising the steps of:

forming a phantom through the utilization of a means for confining a resonating material at discrete locations which are distributed in the form of a matrix in directions orthogonal to each;

placing of said phantom at a position of said magnetic field which is to be measured;

subjecting said phantom, at said position, to magnetic energization sequences in the presence of magnetic field gradient sequences, said gradient sequences defining a main image forming axes;

measuring de-energization signals emitted by said resonating material when said energization ceases and in the absence of said gradient sequences; and processing of said de-energization signals in order to extract from said de-energization signals at least one image representative of said field to be measured, wherein said phantom is placed so that its orthogonal directions are oriented parallel to said main image forming axes.

5. The method according to claim 4, wherein said energization sequences are sufficient in number for the resolution of the representative images to be greater than twice that corresponding to the discrete distribution of the material and the phantom.

6. The method according to claim 5, wherein said resolution is substantially equal to 3 times the distribution of the material.

7. The method according to any one of claims 4, 5 or 6, wherein said energization measuring steps are reiterated while modifying, for said reiteration, the time of measurement of said de-energization signals and/or a number of samples taken during said measurement, in order to improve the knowledge of the characteristics of the field to be measured.

8. The method as claimed in any one of claims 4, 5 or 6, wherein the processing includes three dimensional Fourier transformed calculations for evaluating field inhomogeneities.

9. The method according to any one of claims 4, 5 or 6, wherein said energization-measuring steps are reiterated by modifying, for said reiteration, the characteristics of the energization sequences in order to explore cross sections of the field adjacent, the discrete locations in a multi-section type experimentation.

10. The method according to any one of claims 4, 5 or 6, wherein said gradient sequences correspond to a series of N-phase coding of the magnetic moments of the material, said coding being proportional to applied pulse gradient values.

11. The method according to claim 10, wherein said gradient sequences include a pulse of a gradient for selecting one of the distribution planes of the discrete locations of the phantom.

* * * * *